（12) United States Patent
Kim

(10) Patent No.: US 9,411,680 B2
(45) Date of Patent: *Aug. 9, 2016

(54) COMPOSITE SEMICONDUCTOR MEMORY DEVICE WITH ERROR CORRECTION

(71) Applicant: Conversant Intellectual Property Management Inc., Ottawa (CA)

(72) Inventor: Jin-Ki Kim, Ottawa (CA)

(73) Assignee: CONVERSANT INTELLECTUAL PROPERTY MANAGEMENT INC., Ottawa (CA)

(*) Notice: Subject to any disclaimer, the term of this patent is extended or adjusted under 35 U.S.C. 154(b) by 0 days.

This patent is subject to a terminal disclaimer.

(21) Appl. No.: 14/795,114

(22) Filed: Jul. 9, 2015

(65) Prior Publication Data

US 2015/0309867 A1  Oct. 29, 2015

Related U.S. Application Data

(63) Continuation of application No. 13/038,461, filed on Mar. 2, 2011, now Pat. No. 9,098,430.

(60) Provisional application No. 61/316,138, filed on Mar. 22, 2010.

(51) Int. Cl.
*G11C 29/00* (2006.01)
*G06F 11/10* (2006.01)
(Continued)

(52) U.S. Cl.
CPC ........ *G06F 11/1044* (2013.01); *G06F 11/1048* (2013.01); *H03M 13/05* (2013.01); *H03M 13/611* (2013.01); *G11C 2029/0411* (2013.01)

(58) Field of Classification Search
CPC ................... G11C 2029/0411; G06F 11/1048
USPC .................................................. 714/773, 763
See application file for complete search history.

(56) References Cited

U.S. PATENT DOCUMENTS 9,098,430 B2 * 8/2015 Kim .................... G06F 11/1048
2004/0153939 A1 8/2004 Aoyama et al.
(Continued)

FOREIGN PATENT DOCUMENTS

CN   101324867 A   12/2008
CN   101527171 A   9/2009

OTHER PUBLICATIONS

Lassa, Paul, "The New EZ NAND in ONFi v2.3", SanDisk—Flash Memory Sumit—Aug. 2010, 26 pages.
(Continued)

*Primary Examiner* — Guy Lamarre
(74) *Attorney, Agent, or Firm* — Conversant Intellectual Property Management

(57) ABSTRACT

A composite semiconductor memory device, comprising: a plurality of nonvolatile memory devices; and an interface device connected to the plurality of nonvolatile memory devices and for connection to a memory controller, the interface device comprising an error correction coding (ECC) engine. Also, a memory system, comprising: a memory controller; and at least one composite semiconductor memory device configured for being written to and read from by the memory controller and comprising a built-in error correction coding (ECC) engine. Also, a memory system, comprising: a composite semiconductor memory device comprising a plurality of nonvolatile memory devices; and a memory controller connected to the at least one composite semiconductor memory device, for issuing read and write commands to the composite semiconductor memory device to cause data to be written to or read from individual ones of the nonvolatile memory devices; the composite semiconductor memory device providing error-free writing and reading of the data.

24 Claims, 22 Drawing Sheets

(51) Int. Cl.
   *H03M 13/05* (2006.01)
   *H03M 13/00* (2006.01)
   *G11C 29/04* (2006.01)

(56) References Cited

U.S. PATENT DOCUMENTS

| | | |
|---|---|---|
| 2004/0181733 A1 | 9/2004 | Hilton et al. |
| 2007/0226588 A1 | 9/2007 | Lee et al. |
| 2009/0245400 A1 | 10/2009 | Chen et al. |
| 2010/0023800 A1 | 1/2010 | Harari et al. |
| 2010/0091538 A1 | 4/2010 | Kim et al. |
| 2011/0022928 A1 | 1/2011 | Honda |

OTHER PUBLICATIONS

Cooke, Jim, "Improving Enterprise System Performance With a New Breed of NAND Flash", Copyright 2010 Micron Technology, Inc., Storage Visions 2011, 26 pages.

Samsung Electronics, "2G×8 Bit/4G×8 Bit/8G×8 Bit NAND Flash Memory", K9LBG08U1D K9GAG08U0D K9HCG08U5D Flash Memory, http://lists.infradead.org/pipermail/inux-mtd/attachments/200911/b60cc628/attachment-0001.pdf, downloaded in Feb. 14, 2011, 62 pages.

Pierce Robert, Senior Directory, Flash Products, Denali Software Inc., "NAND Flash—Mr. NAND's Wild Ride: Warning—Surprises Ahead", © 2009 Denali Software, Inc., 8 Pages.

Samsung Electronics Co. Ltd., "1G×8 Bit NAND Flash memory", K9F8G08UXM, K9KAG08U1M, K9F8G08U0M, Flash Memory, Mar. 31, 2007, 54 pages.

Samsung Electronics Co. Ltd., "Advance 16 Gb E-die NAND Flash", Multi-Level-Cell (1 bit/cell) datasheet, K9GAG08U0E, K9HCG08U5E, Rev. 0.4, Nov. 13, 2009, © 2009 Samsung Electronics Co. Ltd., 47 pages.

R. Micheloni et al., "A 4Gb 2b/cell NAND Flash Memory with Embedded 5b BCH ECC for 36MB/s System Read Throughput", 2006 IEEE International Solid-State Circuits Conference, ISSCC 2006/Session 7/Non-Volatile Memory/7.6, Feb. 6, 2006, 4:15 PM, © 2006 IEEE, 10 pages.

Samsung Electronics Co. Ltd., "1G×8Bit/ 2G×8 Bit/ 4G×8 Bit NAND Flash Memory", K9XXG08UXA, K9WAG08U1A, K9K8G08U0A, K9NBG08U5A, Flash Memory, Rev. 1.1, Jul. 18, 2006, 50 pages.

\* cited by examiner

| | |
|---|---|
| Block n-1 | ~1002-(n-1) |
| Block n-2 | ~1002-(n-2) |
| Block n-3 | ~1002-(n-3) |
| Block n-4 | ~1002-(n-4) |
| Cell Array | |
| Block 7 | ~1002-7 |
| Block 6 | ~1002-6 |
| Block 5 | ~1002-5 |
| Block 4 | ~1002-4 |
| Block 3 | ~1002-3 |
| Block 2 | ~1002-2 |
| Block 1 | ~1002-1 |
| Block 0 | ~1002-0 |

| | |
|---|---|
| Page m-1 | ~1102-(m-1) |
| Page m-2 | ~1102-(m-2) |
| Page m-3 | ~1102-(m-3) |
| Page m-4 | ~1102-(m-4) |
| Page 3 | ~1102-3 |
| Page 2 | ~1102-2 |
| Page 1 | ~1102-1 |
| Page 0 | ~1102-0 | jB Data Field 1202 | kB Spare Field 1204

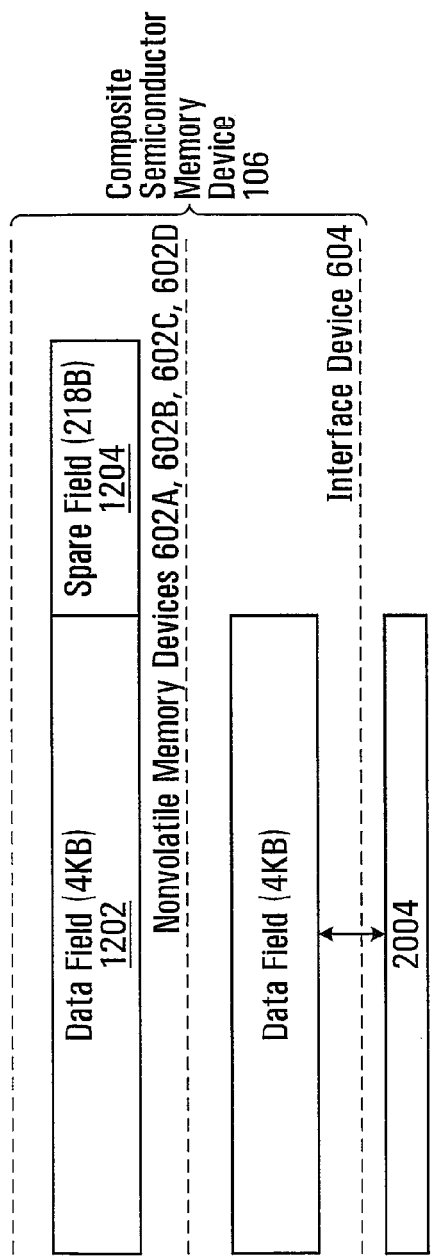
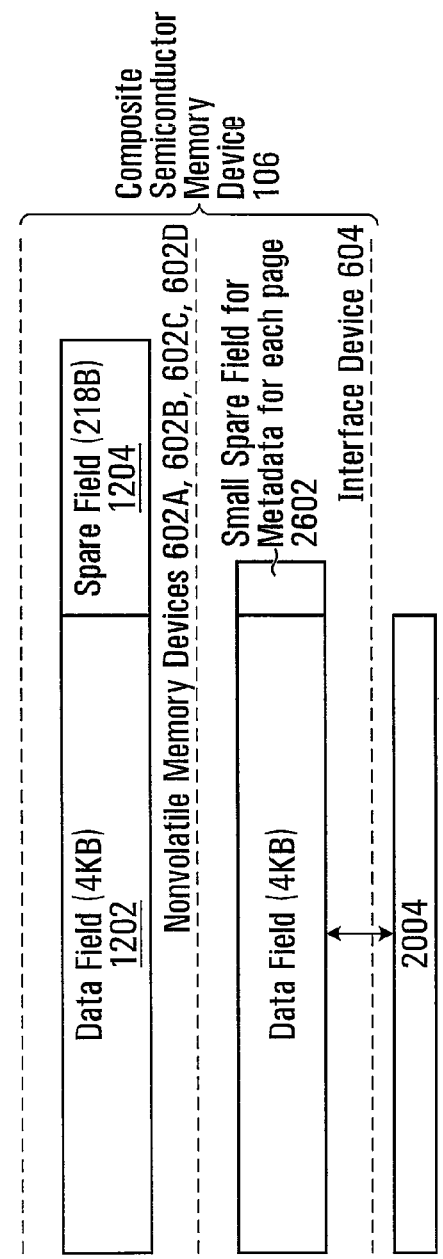
FIG. 25
FIG. 26

COMPOSITE SEMICONDUCTOR MEMORY DEVICE WITH ERROR CORRECTION

CROSS-REFERENCE TO RELATED APPLICATION

This application is a continuation of U.S. patent application Ser. No. 13/038,461, filed on Mar. 2, 2011, now U.S. Pat. No. 9,098,430. U.S. patent application Ser. No. 13/038,461 claim the benefit under 35 USC §119(e) of U.S. Provisional Patent Application Ser. NO. 61/316,138, filed Mar. 22, 2010. U.S. patent application Ser. No. 13/038,461 and U.S. Provisional Patent Application Ser. No. 61/316,138 are incorporated herein by reference in their entireties.

BACKGROUND

There has been a significant increase in the data storage requirements of consumer electronic devices such as digital audio/video players, cell phones, portable universal serial bus (USB) drives and solid state drives (SSDs). This density requirement can be satisfied at relatively low cost by nonvolatile semiconductor memory devices incorporating flash memory, commonly known as flash devices. At present, there are two main types of flash memory, namely NOR flash and NAND flash, and of the two, NAND flash has proven to be especially popular.

However, as flash devices become denser and cheaper, the amount of storage they are expected to provide increases even further. This expectation, in turn, exerts further pressure to render these devices even more dense at an even lower cost costly.

SUMMARY

According to one aspect of the present invention, there is provided a composite semiconductor memory device, comprising: a plurality of nonvolatile memory devices; and an interface device connected to the plurality of nonvolatile memory devices and for connection to a memory controller, the interface device comprising an error correction coding (ECC) engine.

According to another aspect of the present invention, there is provided a memory system, comprising: a memory controller; and at least one composite semiconductor memory device configured for being written to and read from by the memory controller and comprising a built-in error correction coding (ECC) engine.

According to another aspect of the present invention, there is provided a memory system, comprising: a composite semiconductor memory device comprising a plurality of nonvolatile memory devices; and a memory controller connected to the at least one composite semiconductor memory device, for issuing read and write commands to the composite semiconductor memory device to cause data to be written to or read from individual ones of the nonvolatile memory devices; the composite semiconductor memory device providing error-free writing and reading of the data, from a perspective of the memory controller.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIGS. 25-26 highlight the difference between data written to the interface device and the data written by the interface device to a nonvolatile memory device, according to non-limiting embodiments.

DETAILED DESCRIPTION

Figure 1:
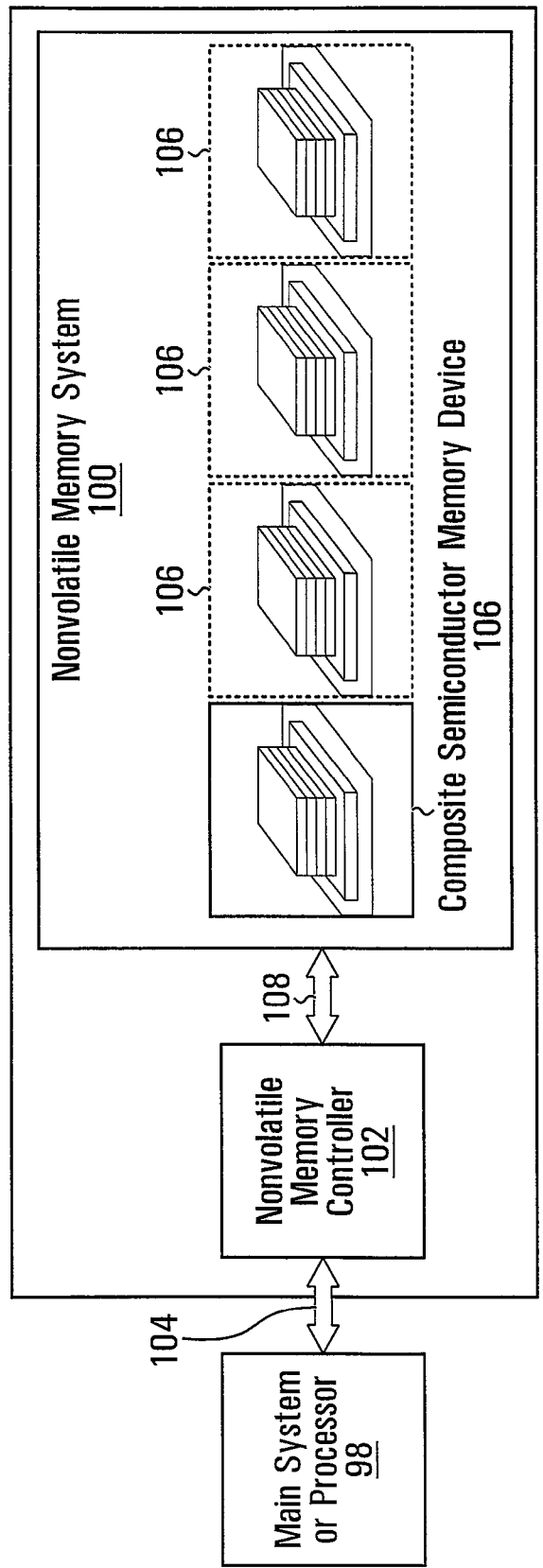
FIG. 1 is a block diagram showing a nonvolatile memory system, according to a non-limiting embodiment.

FIG. 1 shows a block diagram of a nonvolatile memory system 100 according to a non-limiting embodiment. The nonvolatile memory system 100 comprises a memory controller 102 for communicating with a main system or processor 98 via a communication link 104. The nonvolatile memory system 100 also comprises at least one composite semiconductor memory device 106 connected to the memory controller 102 via a communication link 108. The memory controller 102 can be a flash memory controller.

Figure 2:
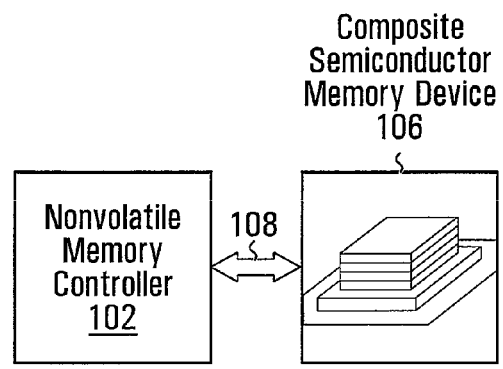
FIG. 2 is a block diagram showing a nonvolatile memory system using a single composite semiconductor memory device, according to a non-limiting embodiment.
Figure 3:
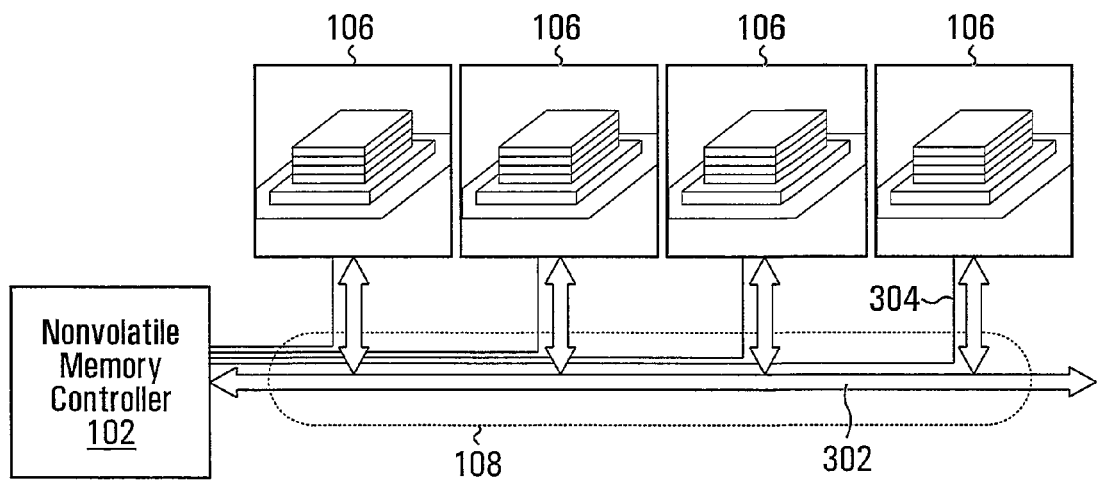
FIGS. 3-5 are block diagrams showing a nonvolatile memory system using plural composite semiconductor memory devices, according to non-limiting embodiments.
Figure 4:
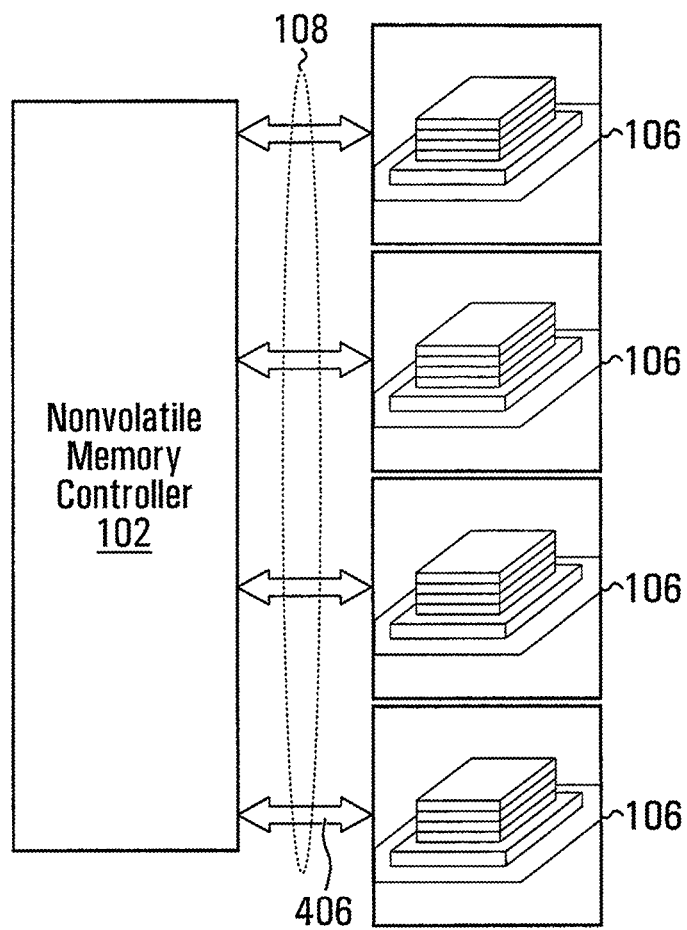
Figure 5:
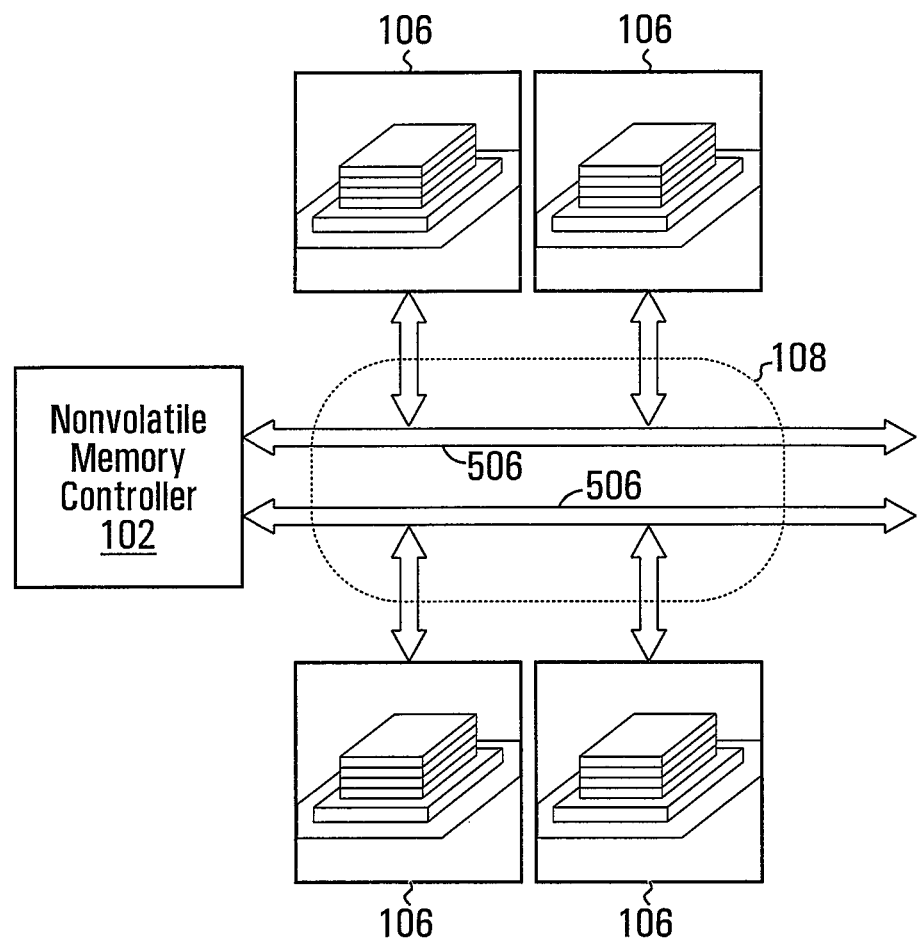

In a non-limiting embodiment, shown in FIG. 2, there may be a single composite semiconductor memory device 106 in the nonvolatile memory system 100. In other non-limiting embodiments, shown in FIGS. 3, 4 and 5, there may be a plurality of semiconductor memory devices 106 in the nonvolatile memory system 100. Although four (4) semiconductor memory devices 106 are illustrated, it should be understood that there is no particular limit on the number of composite semiconductor devices 106 that can be included in the nonvolatile memory system 100.

In embodiments where there are plural composite semiconductor devices 106 in the nonvolatile memory system 100, the communication link 108 can take on various forms. In particular, according to the non-limiting embodiment shown in FIG. 3, the communication link 108 can include a common interface channel (e.g., a multi-drop parallel bus) 302. In addition, dedicated chip-enable signals 304 can be provided to the various composite semiconductor memory devices 106. An individual composite semiconductor memory device 106 can be selected by asserting the corresponding dedicated chip-enable signal 304. According to the non-limiting embodiment shown in FIG. 4, the communication link 108 can employ multiple dedicated interface channels 406 between the memory controller 102 and the composite semiconductor memory devices 106. In this case, each of the composite semiconductor memory devices 106 has its own dedicated interface channel 406. According to the non-limiting embodiment shown in FIG. 5, the communication link 108 can employ multiple dedicated interface channels 506 between the memory controller 102 and the composite semiconductor memory devices 106. In this case, each of the common interface channels 506 is shared by a group of two (2) or more composite semiconductor memory devices 106

Figure 6:
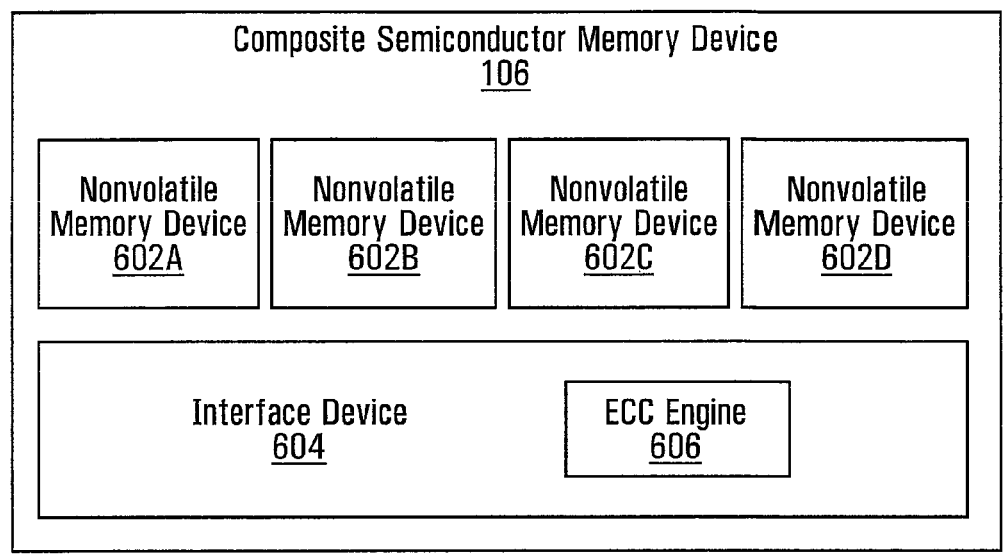
FIG. 6 is a block diagram showing certain components of a composite semiconductor memory device, according to a non-limiting embodiment.

In a non-limiting embodiment, and with reference to FIG. 6, the composite semiconductor memory device 106 comprises a plurality of nonvolatile memory devices 602A, 602B, 602C, 602D and an interface device 604. Although four (4) nonvolatile memory devices 602A, 602B, 602C, 602D are illustrated, it should be understood that there is no particular limit on the number of nonvolatile memory devices 602A, 602B, 602C, 602D that may be connected to the interface device 604. Communication between the interface device 604 and the nonvolatile memory devices 602A, 602B, 602C, 602D is achieved using interface channels, as will be described later on with reference to FIGS. 16-19. The interface device 604 can include an error correction coding (ECC) engine 606. The ECC engine 606 allows the composite memory device 106 to exhibit error-free (as judged from the perspective of the memory controller 102) writing of data to, and error-free (as judged from the perspective of the memory controller 102) reading of data from, the nonvolatile memory devices 602A, 602B, 602C, 602D.

Figure 7A:
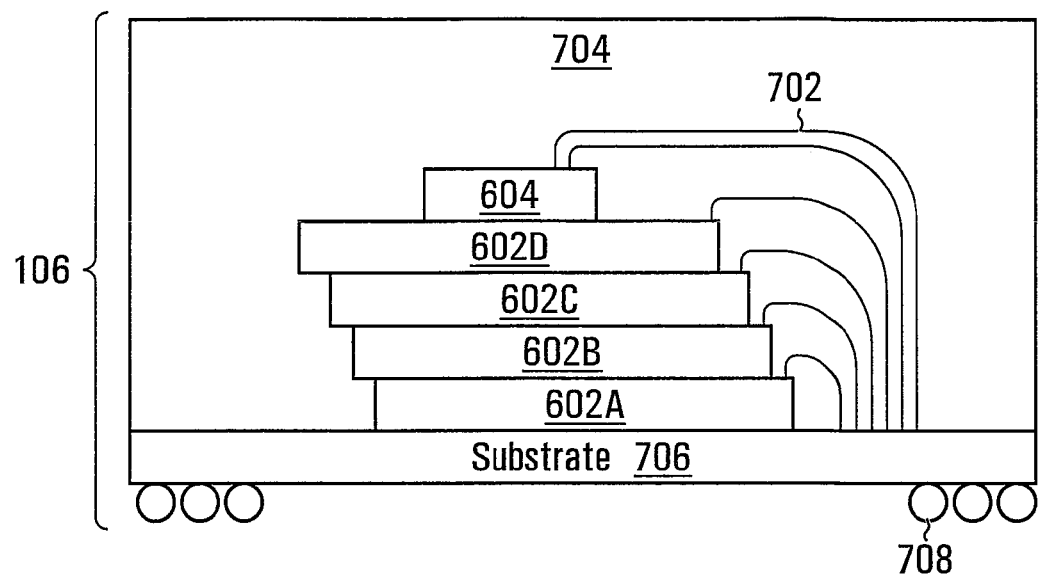
FIGS. 7A, 7B, 8A and 8B depict cross-sectional views of a composite semiconductor memory device, according to, non-limiting embodiments.
Figure 7B:
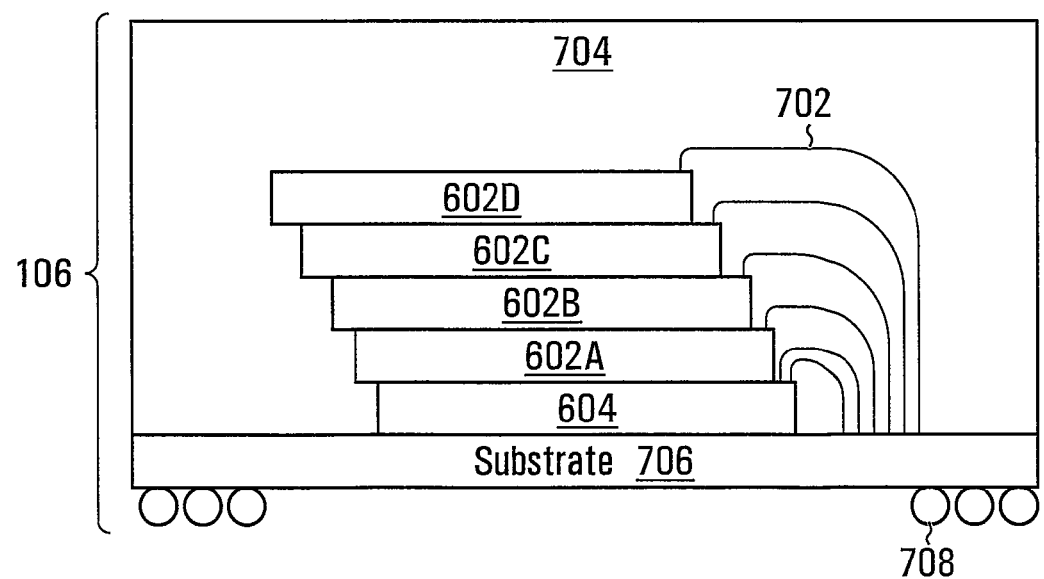
Figure 8A:
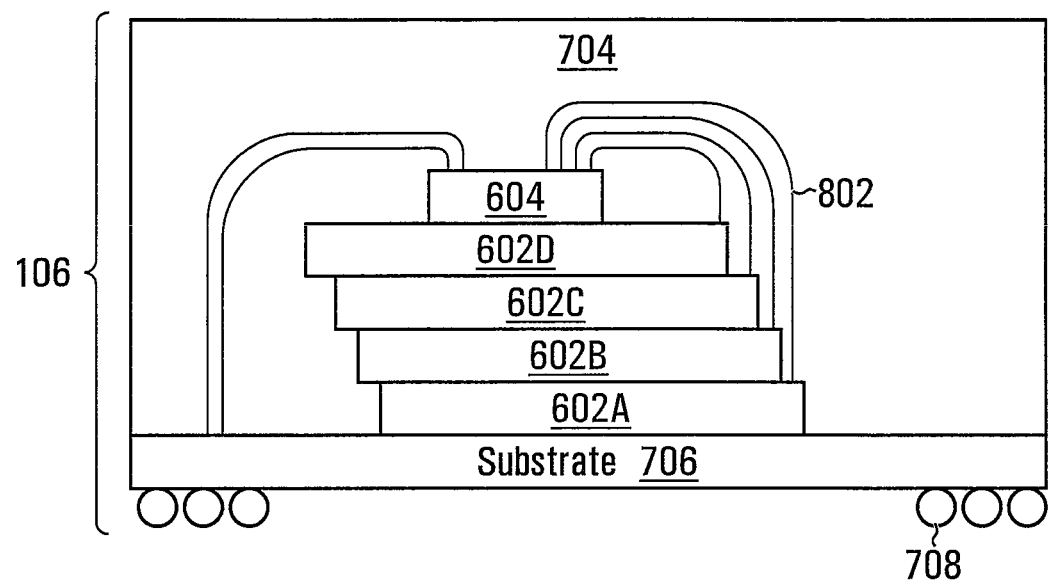
Figure 8B:
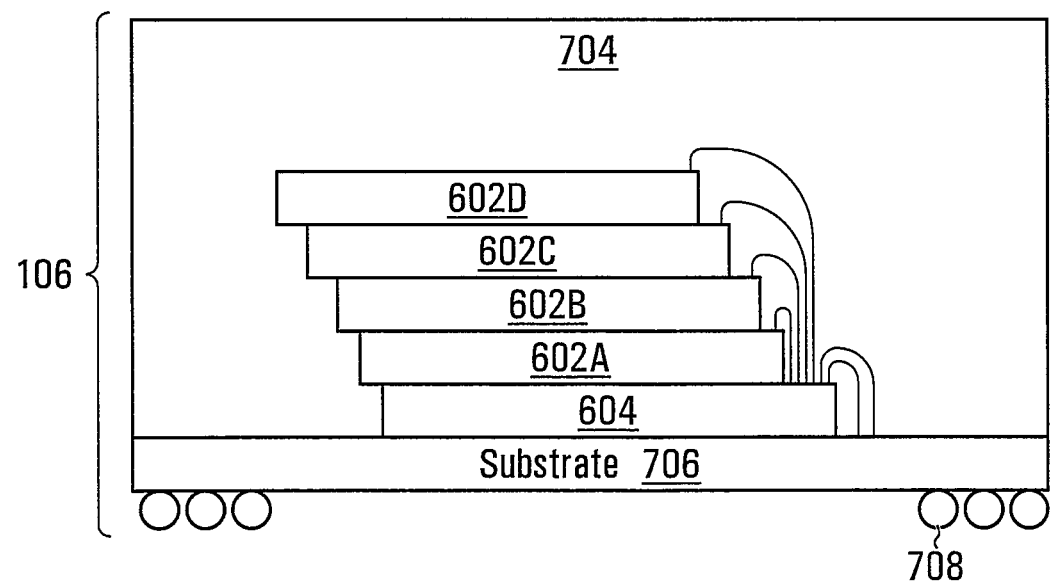

With reference to FIGS. 7A, 7B, 8A and 8B, the interface device 604 and the nonvolatile memory devices 602A, 602B, 602C, 602D can be encapsulated in a single enclosure 704, such as a multi-chip package (MCP). Specifically, nonvolatile memory devices 602A, 602B, 602C, 602D are stacked together onto a substrate 706. In FIGS. 7A and 8A, the interface device 604 is shown as being placed on top of nonvolatile memory devices 602D, while in FIGS. 7B and 8B, the interface device 604 is shown as being at the bottom of a stack of nonvolatile memory devices. Still other configurations are possible without departing from the scope of the invention.

Also shown are bonding pads 708 attached to the substrate 706 to allow electrical connections between the composite semiconductor memory device 106 and other components external thereto. Connections are also provided between the interface device 604 and each of the nonvolatile memory devices 602A, 602B, 602C, 602D. Also, in the embodiments of FIGS. 7A and 7B, wire bonds 702 are established between the interface device 604 and each of the nonvolatile memory devices 602A, 602B, 602C, 602D through the substrate 706. In contrast, in the embodiments of FIGS. 8A and 8B, direct connections 802 are established between the interface device 604 and each of the nonvolatile memory devices 602A, 602B, 602C, 602D. Still other manners of interconnecting the interface device 604 and each of the nonvolatile memory devices 602A, 602B, 602C, 602D are possible. Also, while a stacked die configuration is shown, this is not to be interpreted as limitative.

Nonvolatile Memory Devices 602A, 602B, 602C, 602D

The nonvolatile memory devices 602A, 602B, 602C, 602D can be NAND flash memory devices, NOR flash memory devices or phase-change memory devices, to name just a few non-limiting possibilities. The nonvolatile memory devices 602A, 602B, 602C, 602D can operate asynchronously or synchronously, to name just a few non-limiting possibilities. Also, the nonvolatile memory devices 602A, 602B, 602C, 602D can operate as single data rate (SDR) devices or double data rate (DDR) devices, to name just a few non-limiting possibilities. In a specific non-limiting embodiment, nonvolatile memory devices 602A, 602B, 602C, 602D can abide by an industry specification such as Samsung's 16Gb Multi Level Cell NAND Flash Specification for products K9GAG08U0D, K9LBG08U1D, K9HCG08U5D (as described in a document entitled 2G×8 Bit/4G×8 Bit/8G×8 Bit NAND Flash Memory, available from Samsung Electronics), which provides device operation and timing details and is incorporated by reference herein. Of course, other makes or models of available flash memories can be used as the nonvolatile memory devices 602A, 602B, 602C, 602D.

Figure 9:
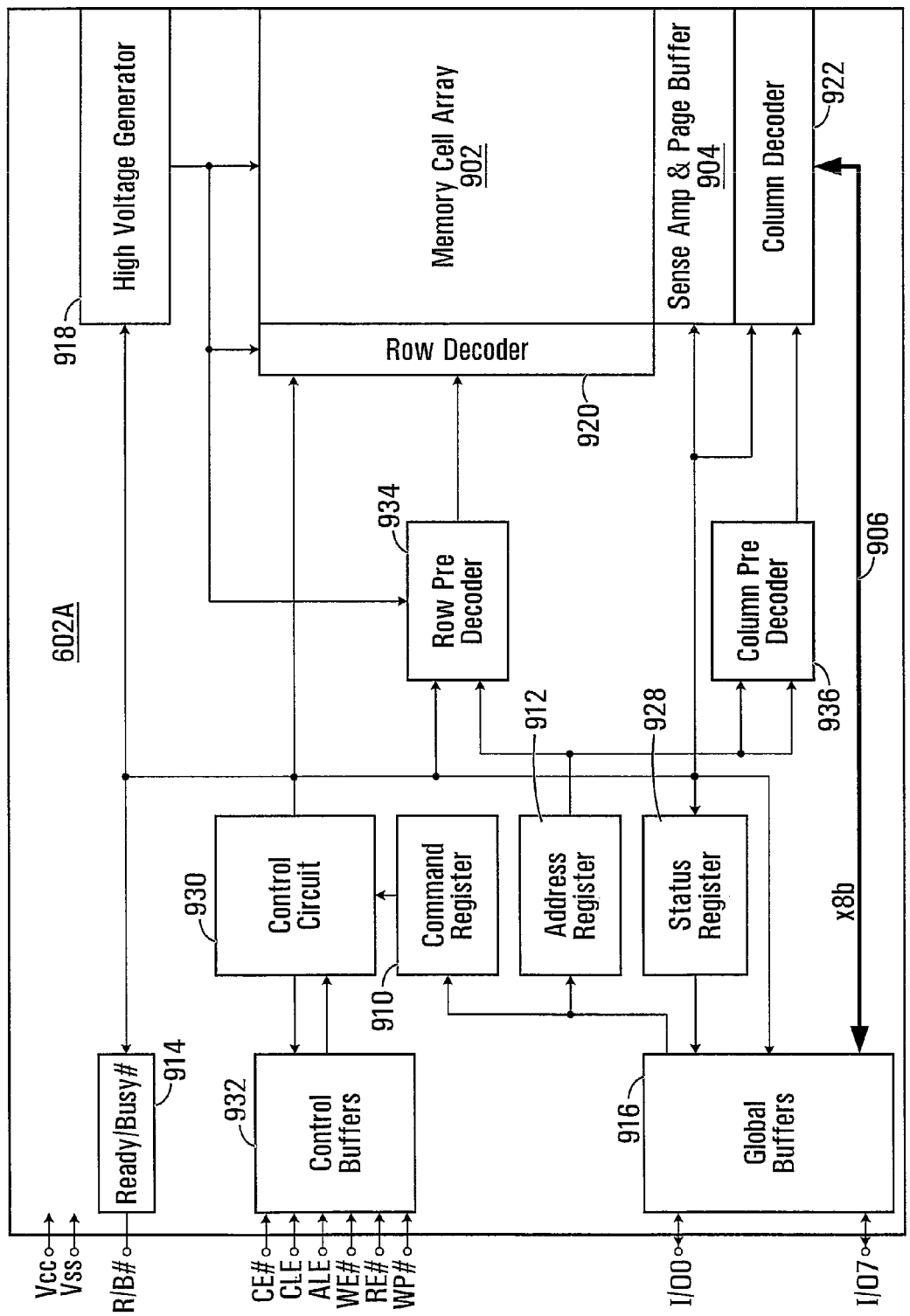
FIG. 9 is a block diagram showing a NAND flash functional block.

FIG. 9 conceptually illustrates various functional components of a nonvolatile memory device (such as, in this example, device 602A) implemented as a NAND flash memory device.

The device 602A utilizes the following ports and signals:

Input/Output (I/O) ports (I/O0 to I/O7): the I/O ports are used for transferring address, command and input/output data to and from the device 602A. In particular, data to be written to the device 602A arrives on the I/O ports I/O0 to I/O7 and is temporarily placed in a set of global buffers 916 prior to being stored in a memory cell array 902. Data to be read from the device 602A is extracted from the memory cell array 902 and is placed in the set of global buffers 916 prior to being released on the I/O ports I/O0 to I/O7;

Write Enable port (WE#): the WE# port receives a WE# signal used to control the acquisition of data from the I/O ports;

Command Latch Enable (CLE) port: the CLE port receives a CLE signal used to control loading of an operation mode command into a command register 910. The command is latched into the command register 910 from the I/O ports on the rising edge of the WE# signal while the CLE signal is asserted;

Address Latch Enable (ALE) port: the ALE port receives an ALE signal used to control loading of address information into an internal address register 912. The address information is latched into the address register 912 from the I/O ports on the rising edge of the WE# signal while the ALE signal is asserted;

Ready/Busy (R/B#) port: the R/B# port is an open drain pin and the output R/B# signal is used by the device 602A to indicate its operating state. Specifically, the R/B# signal indicates whether the device is ready or busy. R/B# circuitry 914 in the device 602A will de-assert the R/B# signal when the device 602A is in a busy state (such as during the read, program and erase operations). After completion of the operation, the R/B# circuitry 914 will re-assert the R/B# signal, indicating that the device 602A is in a ready state.

Chip Enable (CE#) port: the CE# port receives a CE# signal. When the CE# signal is de-asserted while the device 602A is in a ready state (when the R/B# signal is asserted), the device 602A goes into a low-power standby mode. However, the CE# signal is ignored when the device 602A is in a busy state (when the R/B# signal is de-asserted), such as during a read, program or erase operation. That is to say, if the device 602A is in a busy state, the device 602A will not enter standby mode regardless of whether the CE# signal is de-asserted.

Read Enable (RE#) port: the RE# port receives a RE# signal used to control serial data output. Specifically, data to be output by the device 602 is placed on the I/O ports I/O0 to I/O7 after the falling edge of the RE# signal (i.e., when the RE# signal is asserted). An internal column address counter is also incremented (Address=Address+1) on the falling edge the RE# signal.

Write Protect (WP#) port: the WP# port receives a WP# signal used to protect the device 602A from accidental programming or erasing. An internal voltage regulator (high voltage generator 918, which provides necessary high voltages and reference voltages during read, program and erase operations) is reset when the WP# signal is asserted. The WP# signal can be used for protecting data stored in the memory cell array 902 during the power-on/off sequence when input signals are invalid.

Figures 10, 11, 12:
FIG. 10 is a block diagram showing a NAND flash cell array structure.
FIG. 11 is a block diagram showing a NAND flash block structure.
FIG. 12 is a block diagram showing a NAND flash page structure.

FIG. 10 illustrates the cell array structure of the memory cell array 902, which includes n erasable blocks 1002-0 to 1002-(n−1). Each block is subdivided into m programmable pages 1102-0 to 1102-(m−1) as shown in FIG. 11. In turn, each page is subdivided into (j+k) 8-bit bytes as shown in FIG. 12. Specifically, the bytes of each page are divided into a j-byte data storage region (data field 1202) and a k-byte data storage region (spare field 1204). Therefore, the total size of the memory cell array 902 is n blocks, which corresponds to (n*m) pages and therefore equals (n*m*(j+k)) bytes.

The spare field 1204 can be used for error management functions (e.g., to store error control coding parity bits). Also, metadata for each page and/or block (such as the number of erase cycles, address information, bad block information, etc) can be stored in the data field 1202 or in the spare field 1204, depending on the embodiment.

The required size of the spare field 1204 in NAND flash memory is a function of page size, process technology, number of bits per cell (i.e., one bit per cell, two bits per cell, three bits per cell, and so on) and bit error rate. The page size in early generation NAND flash memory was 512 bytes for the data field 1202 and 16 bytes for the spare field 1204. The page size has grown as the process technology has evolved, which has allowed greater memory densities to be achieved. However, this growth has also brought higher bit error rates and hence a need to use stronger error correction coding. An example of a contemporary page size is 8K bytes for the data field 1202 and 436 bytes for the spare field 1204. Also, the size of the data field 1202 and the spare field 1204 can differ among manufacturers of flash memory. However, those skilled in the art should appreciate that embodiments of the present invention impose no specific limitation on the absolute or relative size of the data field 1202 or on the spare field 1204.

With reference again to FIG. 9, the memory core of the device 602A includes, in addition to the memory cell array 902, a row decoder 920, a sense amplifier/page buffer 904 and a column decoder 922. The row decoder 920 is used to select a page for either the read operation or the program operation, or to select a block for the erase operation.

More specifically, during the read operation, the data on the selected page in the memory cell array 902 is sensed and latched into the sense amplifier/page buffer 904. Then, the data stored in the sense amplifier/page buffer 904 is sequentially read out through the column decoder 922 and the global buffers 916. During the program operation, the input data from the global buffers 916 is sequentially loaded into the sense amplifier/page buffer 904 via the column decoder 922. The input data latched in the sense amplifier/page buffer 904 is then programmed into the selected page of the memory cell array 902.

The device 602A also includes a status register 928, which tracks the status of the device 602A during the read, program or erase operations. The status can be encoded to reflect whether an operation has passed or failed, and whether the device 602A is busy or ready.

The device 602A further includes a control circuit 930, which is a central unit having a state machine that controls the device 602A during various operating modes. For example, the aforementioned command register 910 decodes input commands from the global buffer 916, and the decoded command is input to the control circuit 930.

In addition, the device 602A includes control buffers 932 that determine the current operating mode (such as command input, address input, data input, data output and status output) based on the current combination of signals on the input ports, namely the CE#, CLE, ALE, WE#, RE# and WP# ports.

Moreover, the device 602A includes the aforementioned address register 912, which stores a multiplexed column address and row address. This address is demultiplexed by the address register and transferred into a row pre-decoder 934 and a column pre-decoder 936.

In operation, read, program and erase operations are driven by commands. The read and program operations are executed on a page basis, while erase operations are executed on a block basis. For the present example, assume that j=4096 (=4K), k=218, m=128 and n=4096. Thus, the capacities of a page, block, plane and device are given as follows:

1 Page=(4K+218)bytes;
1 Block=128 Pages=(4K+218)bytes×128=(512K+27.25K)bytes;
1 Plane=2048 Blocks=(512K+27.25K)Bytes×2048=(8 G+436M)bits;
1 Device=2 Planes=(8G+436M)Bits*2=(16G+872M)bits.

Figure 13:
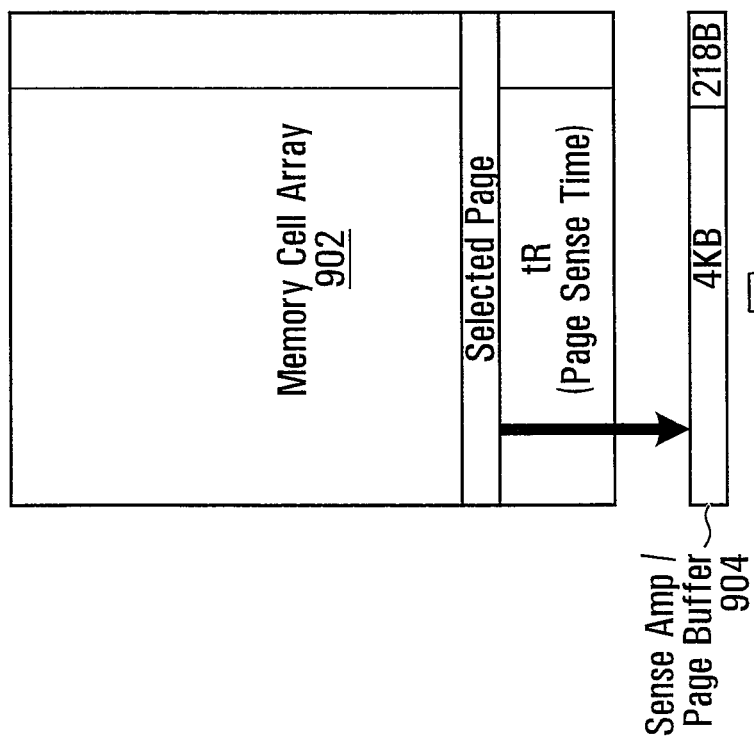
FIG. 13 is a block diagram showing a page-based read operation in NAND flash.

Consider now the read operation, which is executed on a page basis (having a size of (4K+218)bytes=4,314 bytes per page). This operation starts after latching a read command arriving via common I/O pins (I/O0 to I/O7) into the command register 910, followed by latching an address arriving via common I/O pins (I/O0 to I/O7) into the address register 912. With reference to FIG. 13, the 4,314 bytes of data in the identified page are sensed and transferred to the sense amplifier/page buffer 904 in less than tR (data transfer time). Once the 4,314 bytes of data are sensed and transferred from the selected page in the memory cell array 902 to the sense amplifier/page buffer 904, the data in the sense amplifier/page buffer 904 can be sequentially read from the device 602A.

Figure 14:
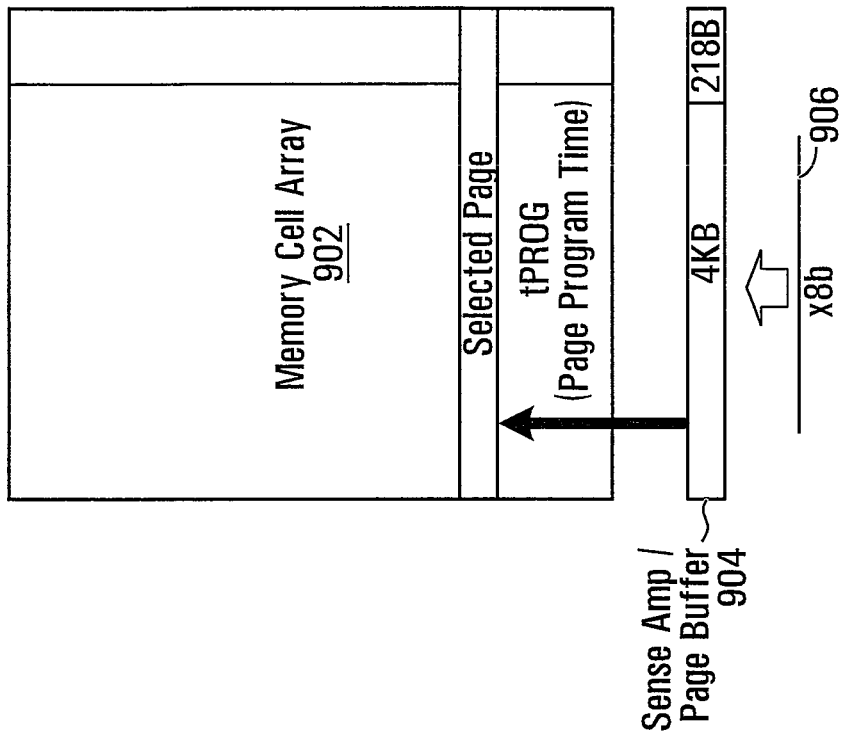
FIG. 14 is a block diagram showing a page-based program operation in NAND flash.

Next, consider the program operation, which is also executed on a page basis. This operation starts after latching a program command arriving via common I/O pins (I/O0 to I/O7) into the command register 910, followed by latching an address arriving via common I/O pins (I/O0 to I/O7) into the address register 912, followed by latching 4,314 bytes of data arriving via common I/O pins (I/O0 to I/O7) into the sense amplifier/page buffer 904. With reference to FIG. 14, these 4,314 bytes of data are programmed to the selected page of the memory cell array 902 in less than tPROG (page program time).

Figure 15:
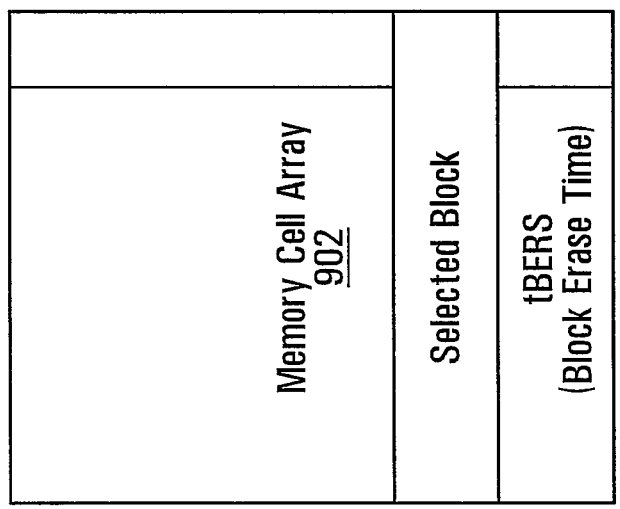
FIG. 15 is a block diagram showing a block erase operation in NAND flash.

Consider now the erase operation, which is executed on a block basis. This operation starts after latching an erase command arriving via common I/O pins (I/O0 to I/O7) into the command register 910, followed by latching an address arriving via common I/O pins (I/O0 to I/O7) into the address register 912. With reference to FIG. 15, the (512K+27.25K) bytes of data are erased in less than tBERS (block erase time).

Communication with the Devices 602A, 602B, 602C, 602D

Figure 16:
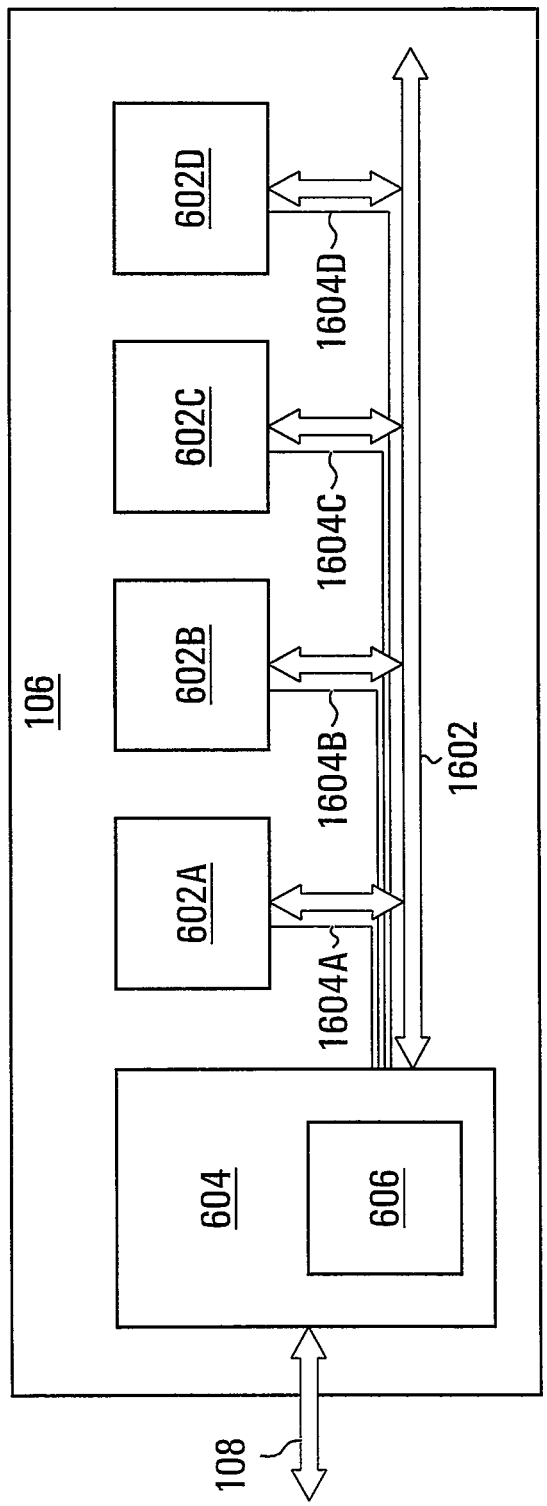
FIG. 16 is a block diagram showing an internal functional architecture of a composite semiconductor memory device according to a non-limiting embodiment, wherein a plurality of nonvolatile semiconductor memory devices are interconnected in a multi-drop fashion.
Figure 17:
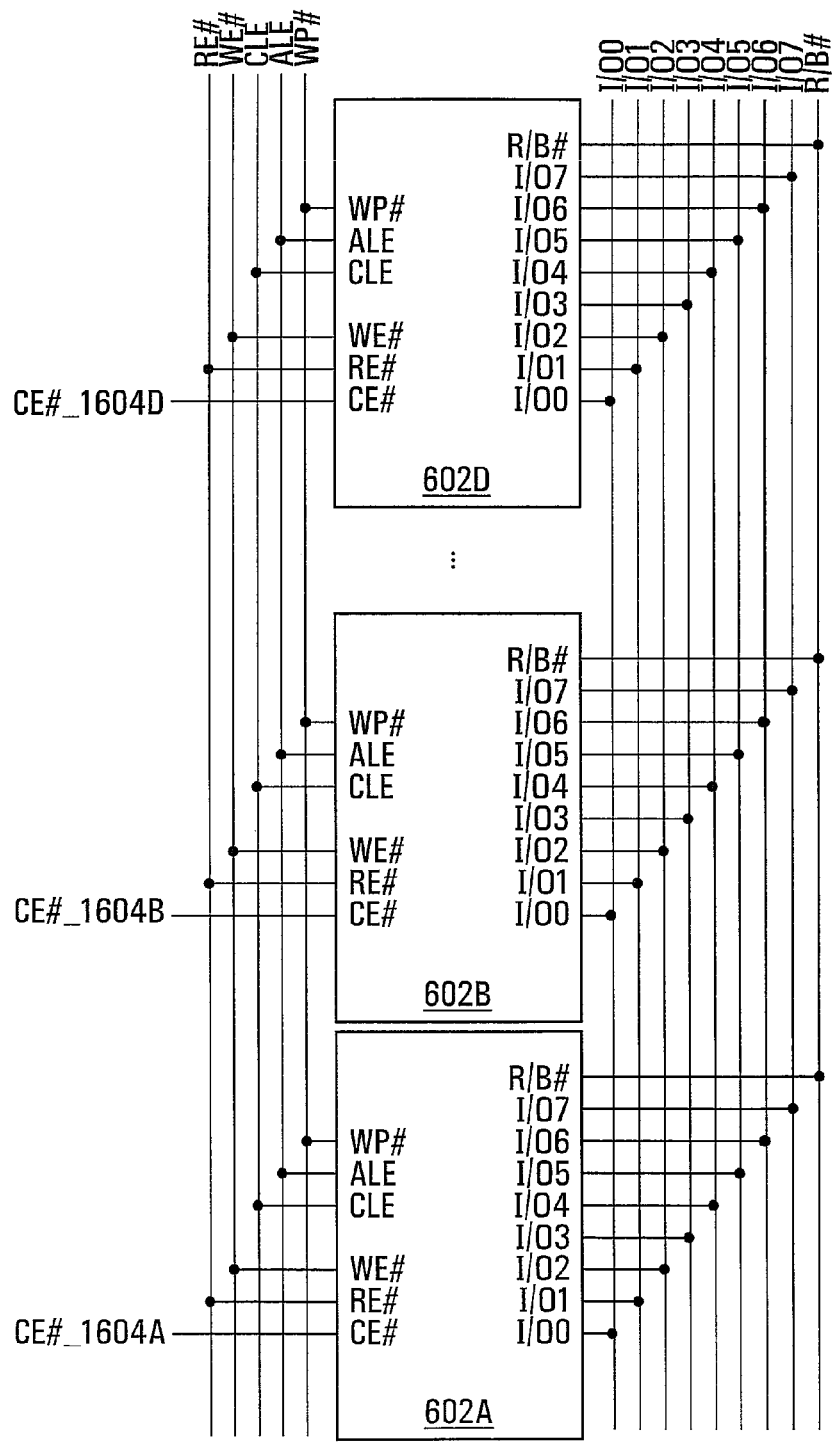
FIG. 17 is a block diagram showing more detail regarding the multi-drop interconnection to the plurality of nonvolatile semiconductor memory devices in FIG. 16.

With reference now to FIGS. 16 and 17, the composite semiconductor memory device 106 can employ a common internal interface channel 1602 to support communication between the interface device 604 and the nonvolatile memory devices 602A, 602B, 602C, 602D. The common interface channel 1602 may be implemented as a multi-drop parallel bus for all the signals CLE, ALE, WE#, RE#, WP#, R/B# and the common I/O pins I/O0 to I/O7. In addition, dedicated chip enable signals CE#_1604A, CE#_1604B, CE#_1604C, CE#_1604D are provided to the nonvolatile memory devices 602A, 602B, 602C, 602D, respectively, allowing selection of an individual nonvolatile memory device on which to carry out a read, program or erase operation. For example, nonvolatile semiconductor device 602A can be selected and accessed by asserting CE#_1604A. The rest of devices (i.e., devices 602B, 602C, 602D) are unselected by de-asserting CE#_1604B, CE#_1604C and CE#_1604D, which results in any input (commands, addresses or data) from the memory controller 102 being ignored. Also, the output signals of the unselected devices are in a high-impedance (i.e., Hi-Z) state.

Figure 18:
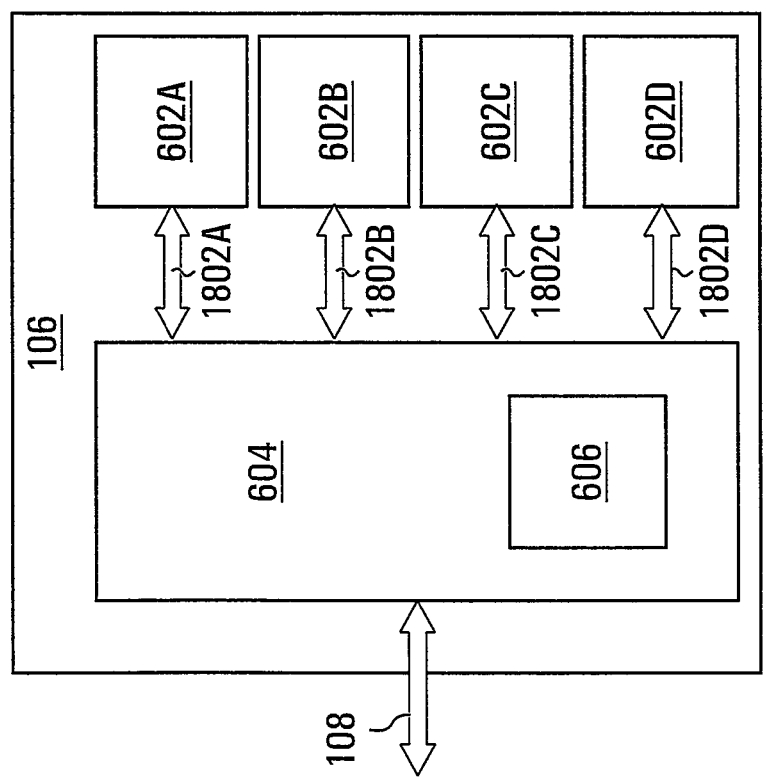
FIG. 18 is a block diagram showing an internal functional architecture of a composite semiconductor memory device according to a non-limiting embodiment, wherein a plurality of nonvolatile semiconductor memory devices are interconnected using dedicated interface channels.

With reference to FIG. 18, the composite semiconductor memory device 106 can employ multiple dedicated interface channels 1802A, 1802B, 1802C, 1802D, which are respectively connected to the nonvolatile memory devices 602A, 602B, 602C, 602D.

Figure 19:
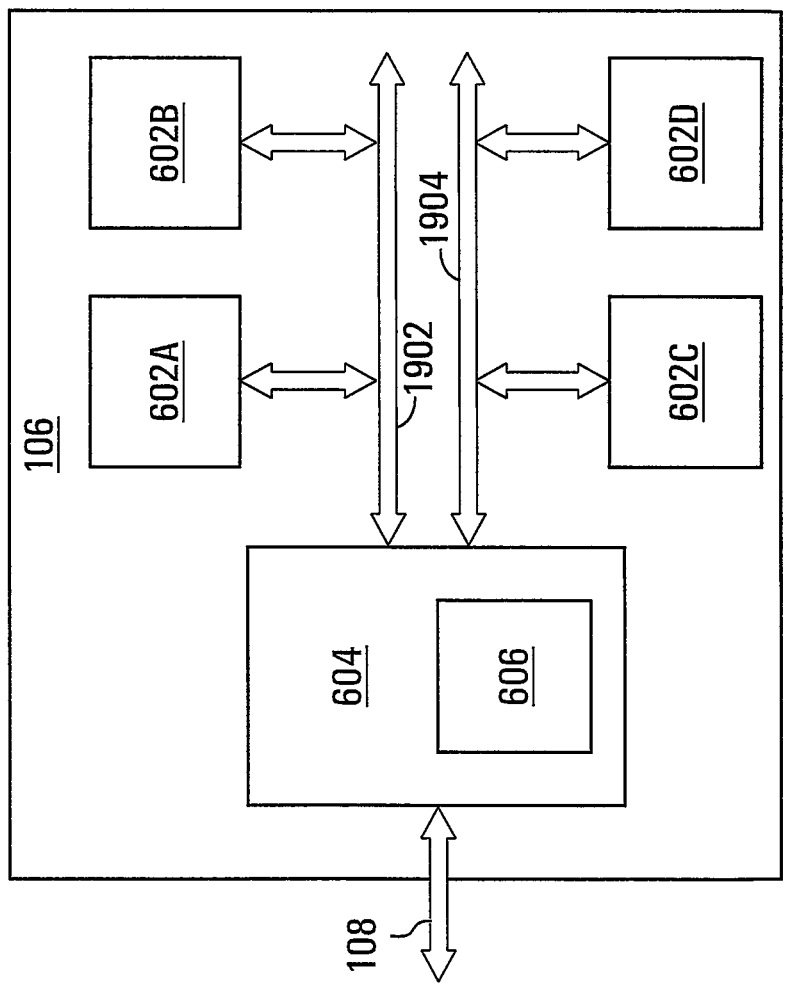
FIG. 19 is a block diagram showing an internal functional architecture of a composite semiconductor memory device according to a non-limiting embodiment, wherein a plurality of nonvolatile semiconductor memory devices are interconnected using group-based interface channels.

With reference to FIG. 19, the composite semiconductor memory device 106 can employ multiple dedicated interface channels 1902, 1904 to support communication between the interface device 604 and the nonvolatile memory devices 602A, 602B, 602C, 602D. In this case, a first group of two nonvolatile memory devices (e.g., devices 602A and 602B) shares common interface channel 1902, while a second group of two nonvolatile memory devices (e.g., the devices 602C, 602D) shares common interface channel 1904. However, it should be understood that the number of groups (and therefore the number of common interface channels), as well as the number of nonvolatile memory devices per common interface channel, is not particularly limited.

Figure 20:
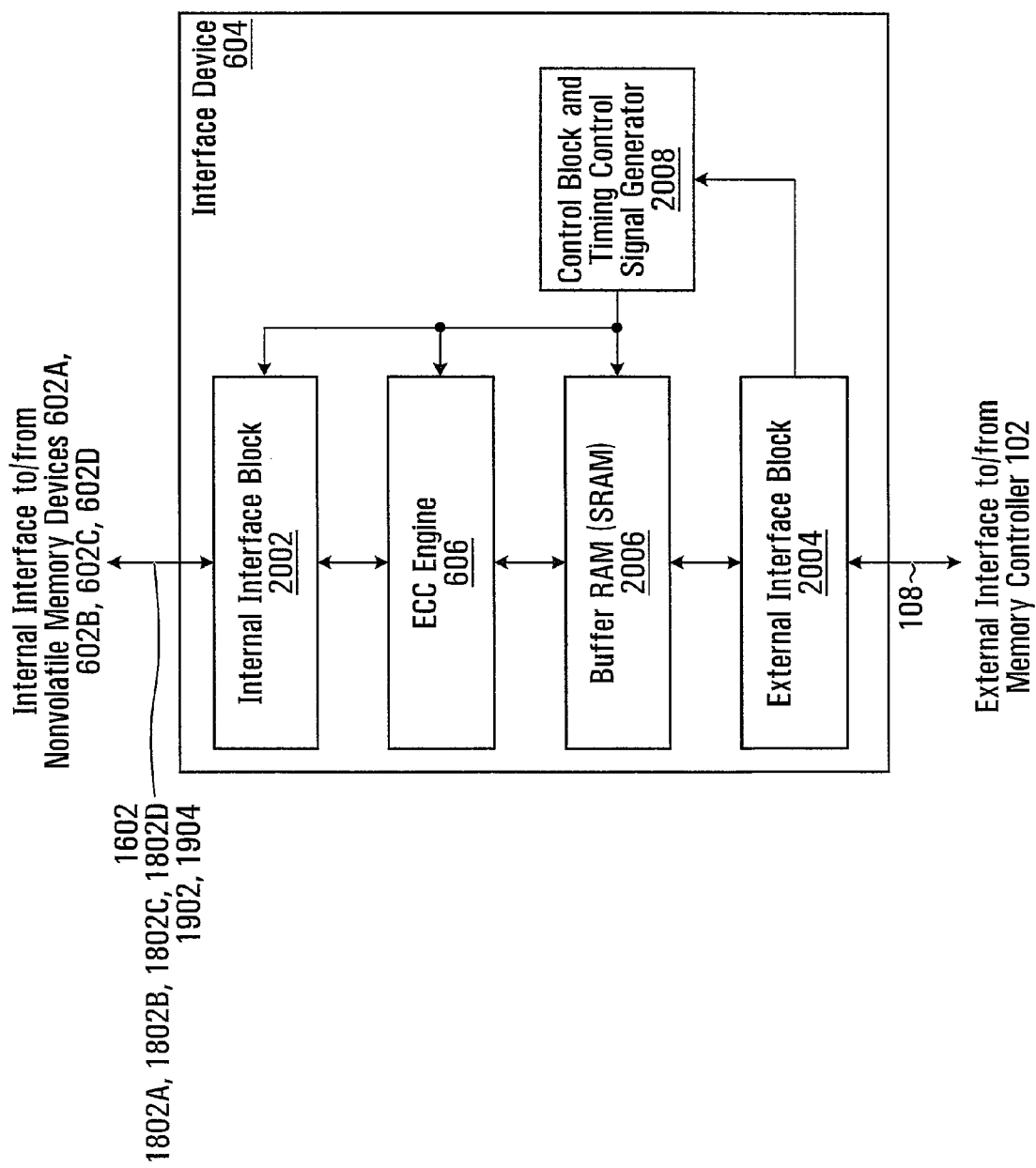
FIGS. 20, 21 and 22 are block diagrams showing different internal configurations of a composite semiconductor memory device according to non-limiting embodiments.

FIG. 20 shows certain functional elements of the interface device 604 according to a non-limiting embodiment. According to this non-limiting embodiment, the interface device 604 can include an external interface block 2004, which interfaces to/from the memory controller 102 over the previously described communication link 108. Among other functions, the external interface block 2004 buffers/generates control signals from/for the memory controller 102, as well as inputs/outputs data from/to the memory controller 102. The external interface block 2004 may have a behavior or functionality characterized as asynchronous NAND flash, asynchronous Double Data Rate (DDR), or synchronous DDR, to name a few non-limiting possibilities. The interface device 604 can also include an internal interface block 2002, which interfaces to/from the nonvolatile memory devices 602A, 602B, 602C, 602D over one ore more interface channels (namely, 1602 or 1802A, 1802B, 1802C, 1802D, or 1902, 1904) as has been previously described. Among other functions, the internal interface block 2002 buffers/generates control signals from/for the nonvolatile memory devices 602A, 602B, 602C, 602D, and inputs/outputs data from/to memory controller 102. The internal interface block 2002 may have a behavior or functionality characterized as asynchronous NAND flash, asynchronous Double Data Rate (DDR), or synchronous DDR, to name a few non-limiting possibilities.

In addition, the interface device 604 includes the aforementioned ECC engine 606. The ECC engine 606 provides error correction coding of data received from the memory controller 102 before it is written to any of the nonvolatile memory devices 602A, 602B, 602C, 602D, as well as error correction decoding of data read from any of the nonvolatile memory devices 602A, 602B, 602C, 602D before it is sent to the memory controller 102.

In addition, the interface device 604 can include buffer memory 2006 (such as static random access memory—SRAM), which temporarily stores input data from the memory controller 102 before ECC encoding, and outputs data to the memory controller 102 after ECC decoding.

The interface device 604 also comprises a control block and timing control signal generator 2008, which generates various control signals including timing control signals required for controlling the external interface block 2004, the internal interface block 2002, the buffer memory 2006 and the ECC engine 606.

Figure 21:
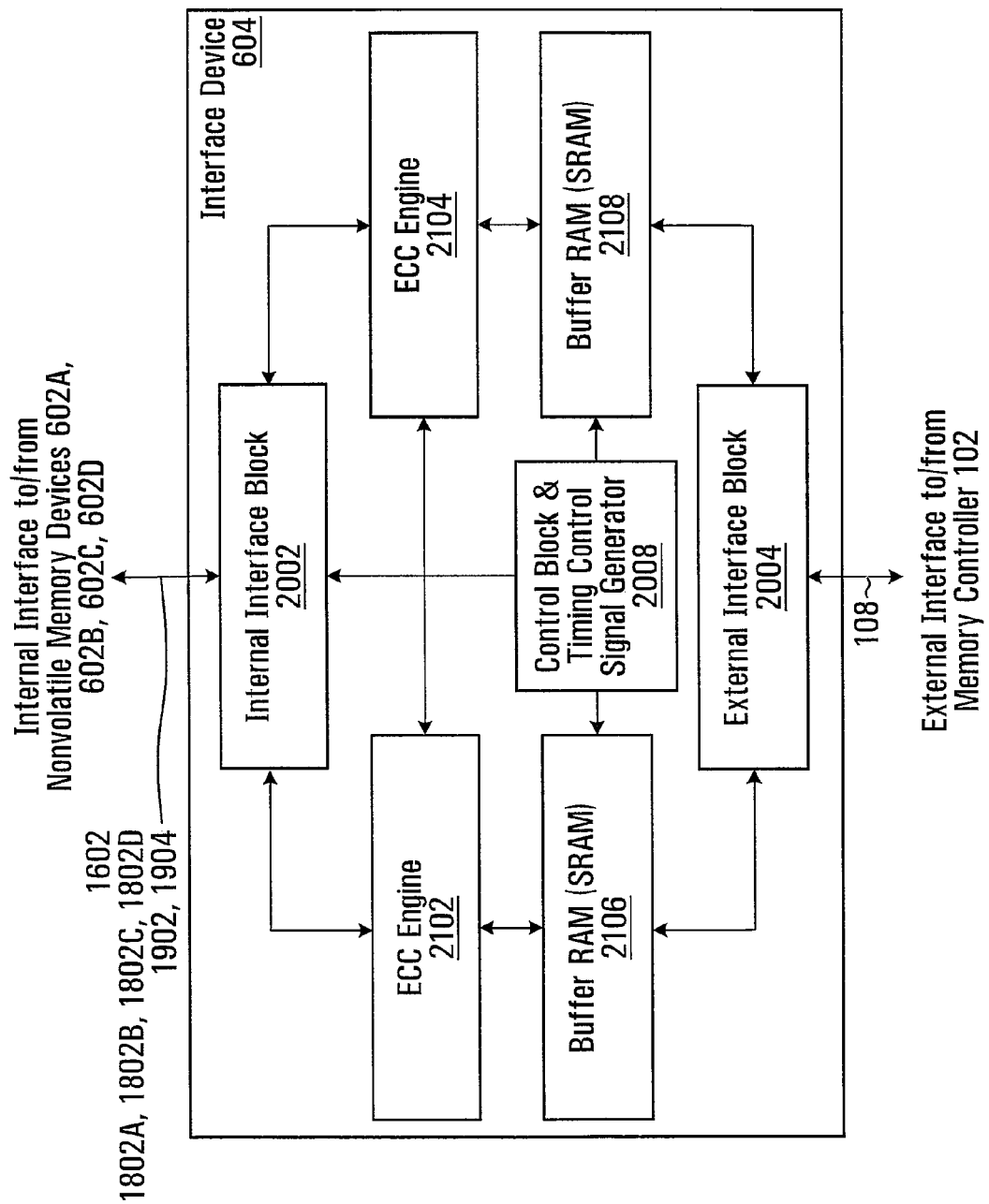

A variant of the embodiment of FIG. 20 is shown in FIG. 21. Here, the ECC engine is implemented as a first ECC engine 2102 and a second ECC engine 2104 configured for operating in parallel in order to share the error control coding and decoding workload. It should be appreciated that the number of ECC engines 2102, 2104 that can be implemented in order to combinedly execute the overall workload of the ECC engine 606 is not particularly limited.

Although it would be possible in this non-limiting embodiment to assign each of the ECC engines 2102, 2104 to a respective pre-determined subset of the nonvolatile memory devices 602A, 602B, 602C, 602D, this is not required. In particular, the flexibility of dynamically assigning each of the ECC engines 2102, 2104 to a different one of the nonvolatile memory devices 602A, 602B, 602C, 602D as the need arises is rendered possible by virtue of the internal interface block 2002 providing access to all the nonvolatile memory devices 602A, 602B, 602C, 602D via the common interface channel 1602.

In the embodiment of FIG. 21, it is also noted that the buffer memory is implemented as a first memory store 2106 associated with the first ECC engine 2102 and a second memory store 2108 associated with the second ECC engine 2104. However, it is also feasible to use a single, larger memory store that is shared between the ECC engines 2102, 2104.

Figure 22:
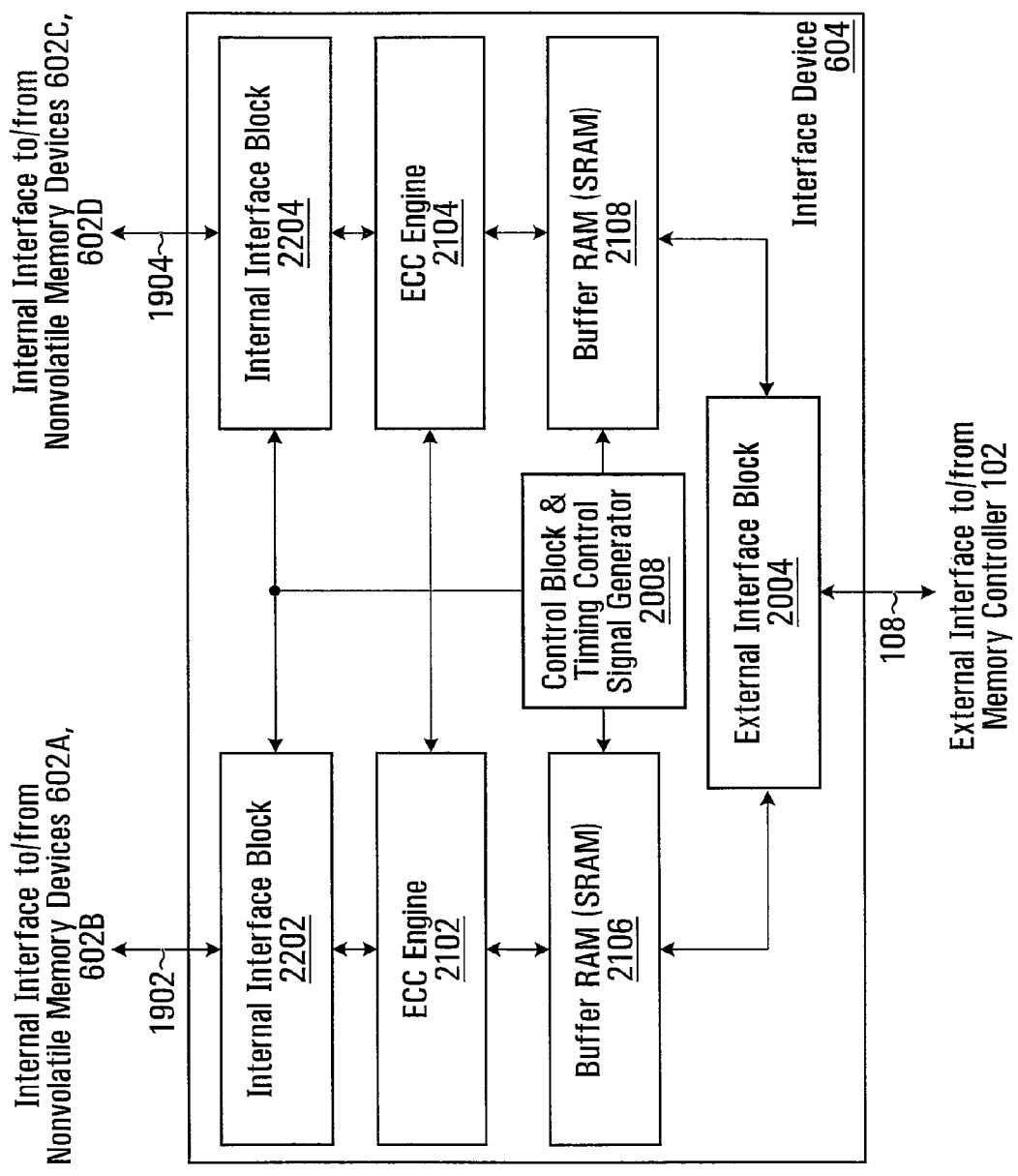

A second variant of the embodiment of FIG. 20 is shown in FIG. 22. Here, the ECC engine is again implemented as the first ECC engine 2102 and the second ECC engine 2104 configured for operating in parallel in order to share the error control coding and decoding workload. Also, as in the embodiment of FIG. 21, it is noted that the buffer memory is implemented as a first memory store 2106 associated with the first ECC engine 2102 and a second memory store 2108 associated with the second ECC engine 2104. Again, the number of ECC engines 2102 that can be implemented in order to combinedly execute the overall workload of the ECC engine 606 is not particularly limited, and it may also be recalled that it is feasible to use a single, larger memory store that is shared between the ECC engines 2102, 2104.

In this embodiment, each of the ECC engines 2102, 2104 is assigned to a respective pre-determined subset of the nonvolatile memory devices 602A, 602B, 602C, 602D. This assignment is determined by the configuration of the internal interface block, which is implemented as a first internal interface block 2202 (communicating with nonvolatile memory devices 602A, 602B over common interface channel 1902) and a second internal interface block 2204 (communicating with nonvolatile memory devices 602C, 602D over common interface channel 1904).

ECC Engine 606

During a program operation, the ECC engine 606 generates ECC control data such as parity data (hereinafter, parity bits) corresponding to input data from the memory controller 102, combines this input data with the ECC parity data, and then programs both to a selected one of the nonvolatile memory devices 602A, 602B, 602C, 602D.

Figure 23:
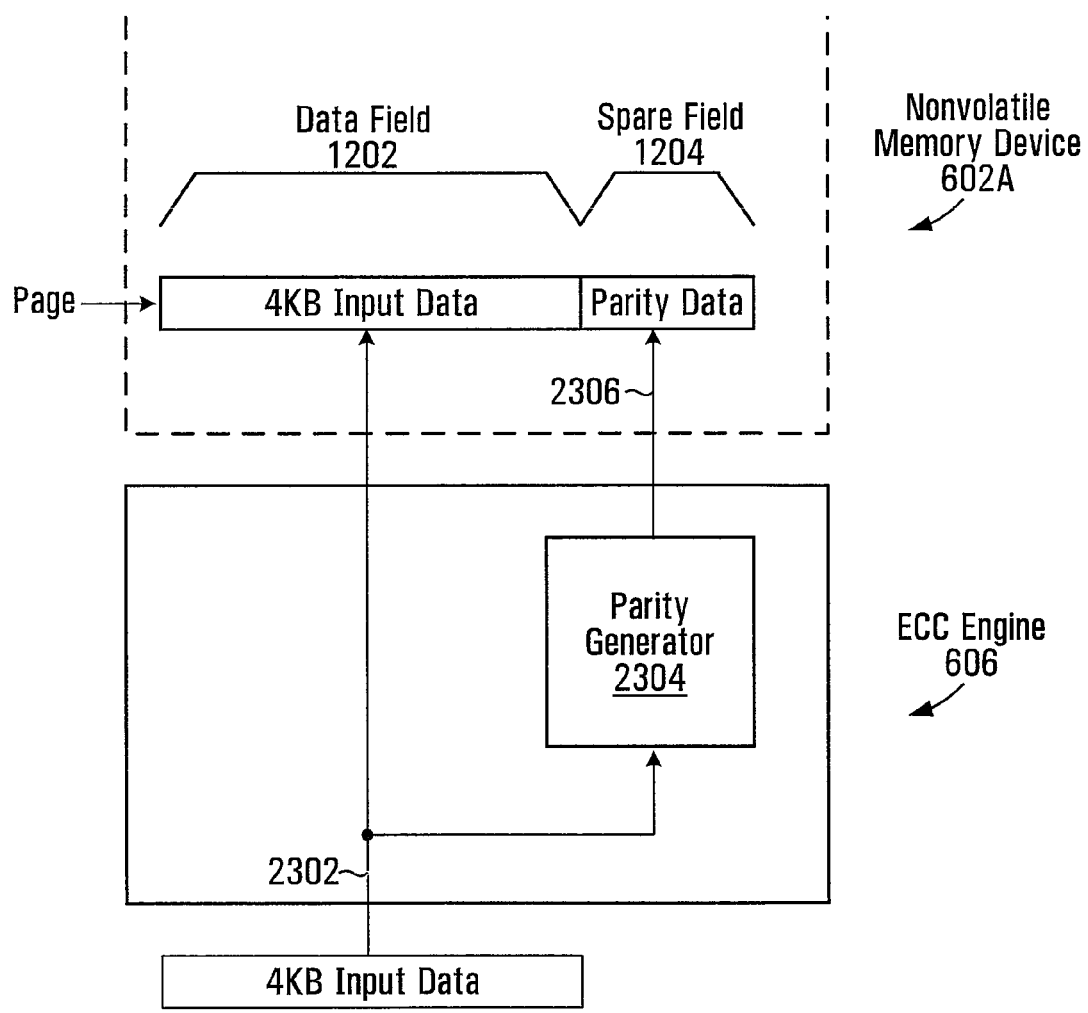
FIG. 23 is a block diagram illustrating an error correction coding process.

More specifically, with reference to FIG. 23 and merely by way of non-limiting example, there is shown an ECC encoding process using a BCH ECC code and a 4 KB page size's worth of input data. The ECC engine 606 is equipped with a parity generator 2304. The parity generator 2304 generates parity data 2306 using 4 KB of input data 2302 destined for a target page in, say, nonvolatile memory device 602A. The parity data 2306 may be generated by segments of the input data 2302 (e.g. 1 KB of 4 KB) or using the complete input data 2302 (see Robert Pierce, "Mr. NAND's Wild Ride: Warning—Surprises Ahead," Denali Software Inc., 2009, hereby incorporated by reference herein). The input data 2302 is programmed to the data field 1202 of the target page, while the parity data 2306 is programmed to the spare field 1204 of the target page.

During a read operation, the ECC engine 606 reads output data with ECC parity data from a selected one of the nonvolatile memory devices 602A, 602B, 602C, 602D, and then performs an ECC operation to generate ECC parity data corresponding to the output data. The ECC engine 606 then compares the extracted and generated ECC parity data and, if necessary, corrects the output data before providing it to the memory controller 102.

Figure 24:
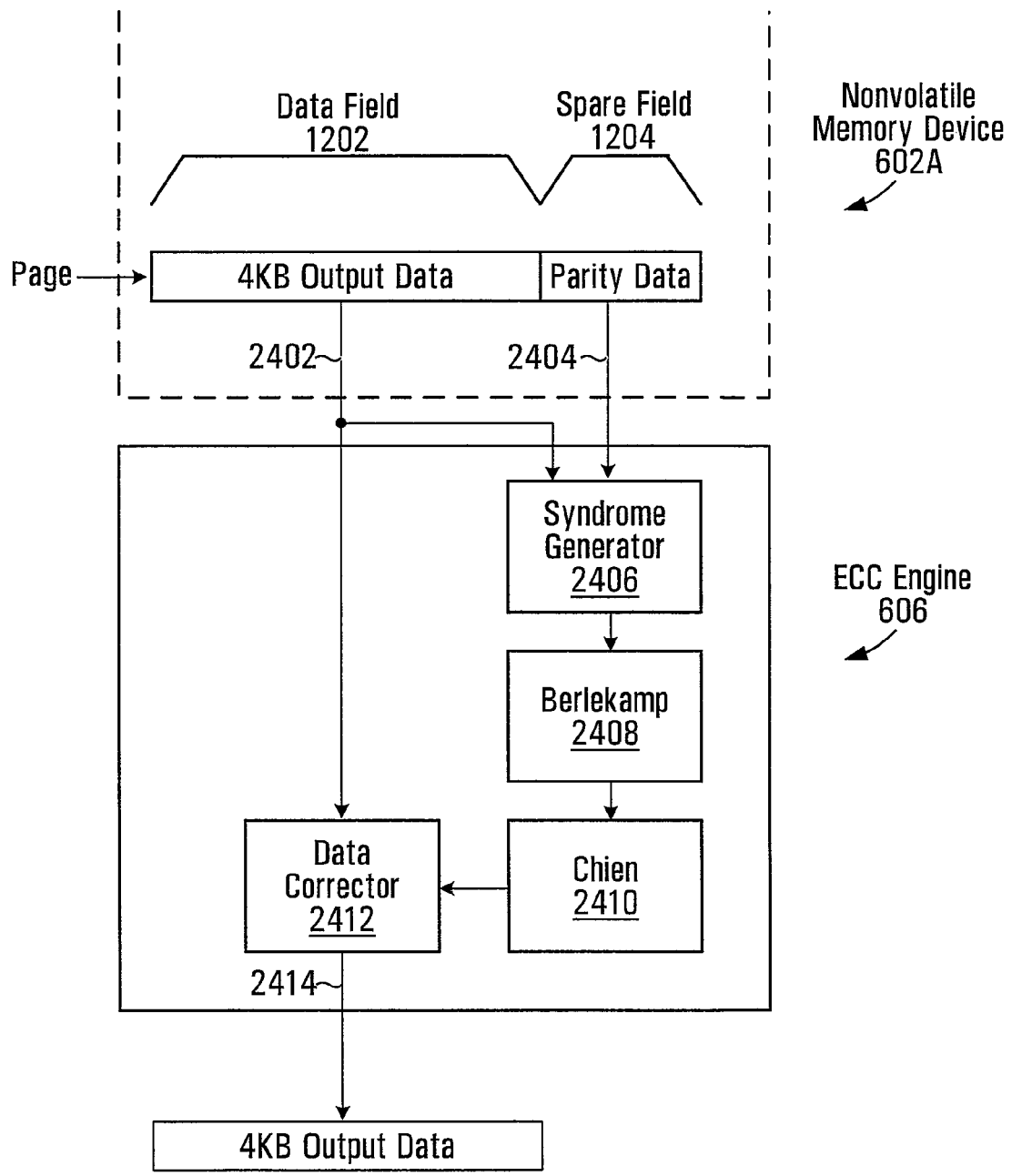
FIG. 24 is a block diagram illustrating an error correction decoding process.

More specifically, with reference to FIG. 24 and merely by way of non-limiting example, there is shown an ECC decoding process using a BCH ECC code and a 4 KB page size's worth of output data. The ECC engine 606 is equipped with a syndrome generator 2406, a Berlekamp block 2408, a Chien block 2410 and a data corrector 2412. The syndrome generator 2406 computes and generates syndromes using 4 Kb of output data 2402 and parity data 2404 read out from, say, nonvolatile memory device 602A in order to determine whether there is (are) any error(s). The syndromes are input to Berlekamp block 2408 that determines an error locator polynomial and the number of errors. The Chien block 2410 finds the polynomial roots (that are the error positions) in the error locator polynomial output by the Berlekamp block 2408. Finally, the output data 2402 is corrected by the data corrector block 2412 if indeed there was (were) found to be any error(s) based on the output of the Chien block 2410. The output of the data corrector block 2412 is therefore corrected data 2414 which is then provided to the memory controller 102.

For simplicity, the above embodiment has assumed that the input data and output data subjected to error correction coding and decoding occupied the entire data field 1202. Where it is desired to include metadata, this metadata can be stored in the spare field 1204. In an alternative embodiment, the metadata can occupy part of the data field 1202, and the input data/output data subjected to error correction coding/decoding can occupy the portion of the data field 1202 that does not include the metadata.

It should be appreciated that the ECC operations described above are simplified and in no way limiting. Those skilled in the art will understand that there are numerous possible ways to implement error correction coding and decoding in the context of reading and writing data to a nonvolatile memory device, and which can be used within the context of the present invention. Error correction coding (ECC) algorithm correction strength (the number of bit errors that can be corrected) depends on the ECC algorithm used to correct the errors (these algorithms may be implemented in either hardware or software). Simple Hamming codes can correct single bit errors. Reed-Solomon codes can correct more errors and are widely used. BCH (Bose, Ray-Chaudhuri, Hocquenghem) codes can also correct multiple bit errors and are popular because of their improved efficiency over Reed-Solomon codes. Still other non-limiting examples exist, such as Low Density Parity Code (LDPC), turbo codes, Golay codes and various other concatenated, convolutional and block codes.

From the point of view of the memory controller 102, and with reference to the non-limiting embodiment in FIG. 25, the final page format (i.e., the size of the data exchanged between the memory controller 102 and the composite memory device 106) can include only the data in the data field 1202, without regard for the data in the spare field 1204. That is to say, the memory controller 102 does not write data to or read data from the spare field 1204. Rather, it is the interface device 604 that fills the spare field 1204 with the parity bits generated by the ECC engine 606. In such an embodiment, the spare field 1204 is hidden to users (and indeed to the memory controller 102) and the memory controller 102 does not need to concern itself with error control coding or decoding. This allows the memory controller 102 to function with disabled ECC functionality or without any ECC functionality at all.

In the embodiment of FIG. 25 described above, it will be appreciated that either metadata is not provided to the composite semiconductor device 106 by the memory controller 102, or such metadata was already embedded in the data field 1202. An embodiment also exists where the metadata is provided separately, outside the data field 1202. Specifically, in a non-limiting embodiment shown in FIG. 26, the final page format (i.e., the size of the data exchanged between the memory controller 102 and the composite memory device 106) can include not only the data in the data field 1202, but also a small added spare field 2602 (e.g., 16 or 20 bytes without being limited thereto), which is smaller than the size of the spare field 1204. The added spare field 2602 can be used to store metadata for the page (such as the number of erase cycles, address information, bad block information, etc). In this embodiment, the interface device 604 fills the spare field 1204 with (i) the parity bits generated by the ECC engine 606 and (ii) the metadata from the spare field 2602. In such an embodiment, only the added spare field 2602 is visible to users, while the spare field 1204 remains hidden to users, as well as to the memory controller 102. Here again, the memory controller 102 does not need to concern itself with error control coding or decoding, thus allowing the memory controller 102 to function with disabled ECC functionality or without any ECC functionality at all.

Memory Controller 102

Figure 27:
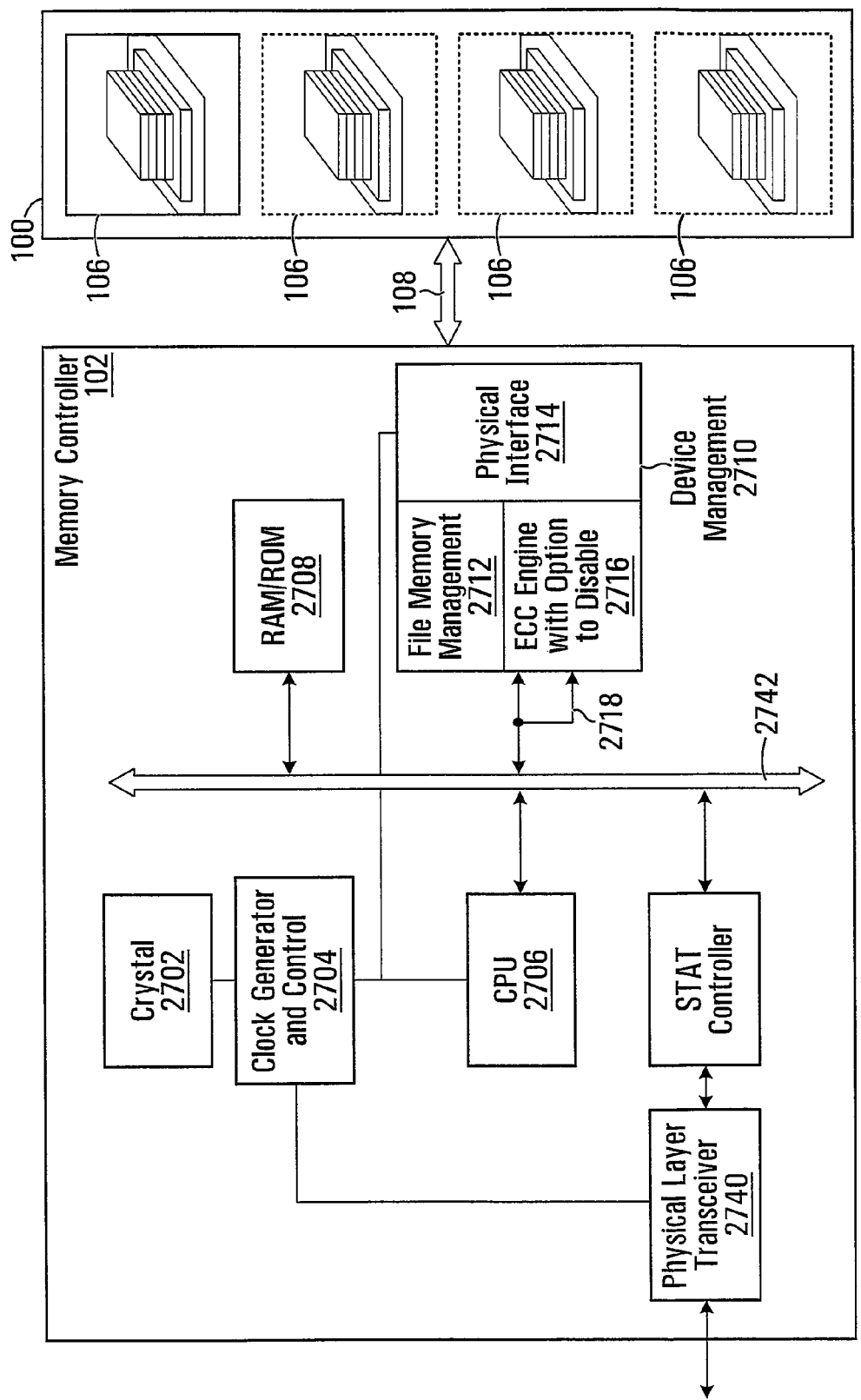
FIG. 27 is a functional block diagram of a memory controller, according to a non-limiting embodiment.

With reference now to FIG. 27, there is shown a functional block diagram of the memory controller 102 according to a non-limiting embodiment. The memory controller 102 comprises a crystal 2702, which provides a base clock signal that is fed to a clock generator and control block 2704. The clock generator and control block 2704 provides various clock signals to a central processing unit (CPU) 2706, a device management block 2710 and a physical layer transceiver 2740 (in this example, a serial ATA PHY). The CPU 2706 (which can be a microprocessor controller) communicates with other subsystems by a common bus 2742. In addition, a memory store 2708 containing random access memory (RAM) and read-only memory (ROM) can be provided; RAM is used as buffer memory and ROM stores computer-readable code (instructions) executable by the CPU 2706.

The device management block 2710 includes a physical interface 2714, and a file and memory management block 2712. The at least one composite semiconductor memory device 106 is (are) accessed through the physical interface 2714. The file and memory management block 2712 provides logical-to-physical address translation and applies a wear-leveling algorithm.

In one non-limiting embodiment, the device management block 2710 includes an ECC (Error Correction Code) engine 2716 that can be controllably disabled upon receipt of a disable signal 2718 from the CPU 2706. In another non-limiting embodiment, the ECC engine 2716 is disabled in hardware. In yet another non-limiting embodiment, the device memory controller 102 does not include an ECC engine or error correction circuitry. If provided, the ECC engine 2716 can check and correct data accessed from the at least one composite semiconductor memory device 106.

It should be appreciated that the connection of increasingly greater numbers of composite semiconductor memory devices 106 to the memory controller 102 does not change the ECC processing load of the memory controller 102. This is because the ECC requirements are distributed among the composite semiconductor memory devices 106. In fact, the memory controller 102 is not required to perform any error correction coding or decoding at all, since error-free performance of the nonvolatile memory devices 602A, 602B, 602C, 602D (as judged from the perspective of the memory controller 102) is assured by the ECC engine 606 in the interface device 604.

Moreover, the interface device 604 can be designed to carry out ECC in parallel for multiple reads and/or writes in parallel, leading to potentially improved memory access times.

In addition, as each composite semiconductor memory device 106 has its own ECC engine 606, the memory controller 102 is not constrained to a single read or write at a time. Rather, the memory controller 102 can issue two (or possibly more) commands that cause data related to these commands (e.g., read data or write data for each command) to flow simultaneously through the memory controller 102.

Moreover, it should be appreciated that since the ECC engine 606 is located in the interface device 604, evolving ECC requirements will be tracked by progress in the design of the interface device 604, but meanwhile the same memory controller 102 can continue to be used. Advantageously, reuse of the same inventory of memory controller can potentially last over multiple different generations of flash memory devices and can also span manufacturers and process technologies. Furthermore, changes in the size of the spare field 1204 (which can be driven by evolving ECC requirements) will not have an effect on the design of the memory controller 102.

In addition, hiding the spare field 1204 from a user's point of view, simplifies developer effort when designing and using the memory controller 102. Moreover, if a spare field 2602 is employed by the user, it can be kept small and of a consistent size, so as to store the requisite metadata for page management (e.g., the number of erase cycle, address information, bad block information, etc).

In the embodiments described above, the device elements and circuits are connected to each other as shown in the figures, for the sake of simplicity. In practical applications of the present invention, elements, circuits, etc. may be connected directly to each other. As well, elements, circuits etc. may be connected indirectly to each other through other elements, circuits, etc., necessary for proper operation. Thus, in an actual configuration, the circuit elements and circuits are directly or indirectly coupled with or connected to each other.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A method for writing data in a composite memory device, the composite memory device including an interface device with an external interface for communicating with an external controller, an ECC engine, and a plurality of internal interfaces for communicating with a plurality of non-volatile memory devices, the method comprising:
receiving a write command via the external interface;
receiving write input data via the external interface;
generating write parity data in the ECC engine using the write input data;
transferring the write input data together with the write parity data to any selected one of the plurality of non-volatile memory devices; and
programming the write input data together with the write parity data in the selected one of the plurality of non-volatile memory devices.

2. The method as claimed in claim 1 wherein the interface device comprises a plurality of ECC engines which are dynamically assignable to any one of the plurality of non-volatile memory devices.

3. The method as claimed in claim 1 wherein each of the plurality of internal interfaces communicates with more than one of the plurality of non-volatile memory devices.

4. The method as claimed in claim 1 wherein each of the plurality of internal interfaces comprises a plurality of input/output ports for transferring address, command, and data between the interface device and a selected one of the plurality of non-volatile memory devices.

5. The method as claimed in claim 1 wherein the interface device provides a dedicated chip enable signal to each of the plurality of non-volatile memory devices.

6. The method as claimed in claim 1 wherein the plurality of internal interfaces are DDR interfaces.

7. The method as claimed in claim 1 wherein the write input data is a page of data in size.

8. The method as claimed in claim 7 wherein the write input data is programmed in the data field of a page in the selected one of the plurality of non-volatile memory devices and the write parity data is programmed in the spare field of the page.

9. The method as claimed in claim 1 wherein the ECC engine generates the write parity data with a selected one of the Hamming, Reed-Solomon, BCH, LDPC, turbo, Golay, concatenated, convolutional, and block coding algorithms.

10. The method as claimed in claim 1 wherein the interface chip and the plurality of non-volatile memory devices are stacked.

11. The method as claimed in claim 1 wherein the interface chip and the plurality of non-volatile memory devices are connected through a substrate.

12. The method as claimed in claim 1 wherein the interface chip and the plurality of non-volatile memory devices are connected with wire bonds.

13. A method for reading data in a composite memory device, the composite memory device including an interface device with an external interface for communicating with an external controller, an ECC engine, and a plurality of internal interfaces for communicating with a plurality of non-volatile memory devices, the method comprising:
   receiving a read command via the external interface;
   reading read output data and read parity data in any selected one of the plurality of non-volatile memory devices;
   transferring the read output data together with the read parity data to the interface device;
   generating check parity data in the ECC engine using the read output data;
   correcting the read output data if the read parity data does not match the check parity data; and
   transferring the corrected read output data to the external interface.

14. The method as claimed in claim 13 wherein the interface device comprises a plurality of ECC engines which are dynamically assignable to any one of the plurality of non-volatile memory devices.

15. The method as claimed in claim 13 wherein each of the plurality of internal interfaces communicates with more than one of the plurality of non-volatile memory devices.

16. The method as claimed in claim 13 wherein each of the plurality of internal interfaces comprises a plurality of input/output ports for transferring address, command, and data between the interface device and a selected one of the plurality of non-volatile memory devices.

17. The method as claimed in claim 13 wherein the interface device provides a dedicated chip enable signal to each of the plurality of non-volatile memory devices.

18. The method as claimed in claim 13 wherein the plurality of internal interfaces are DDR interfaces.

19. The method as claimed in claim 13 wherein the read output data is a page of data.

20. The method as claimed in claim 19 wherein the read output data is read from the data field of a page in the selected one of the plurality of non-volatile memory devices and the read parity data is read from the spare field of the page.

21. The method as claimed in claim 13 wherein the ECC engine generates the check parity data with a selected one of the Hamming, Reed-Solomon, BCH, LDPC, turbo, Golay, concatenated, convolutional, and block coding algorithms.

22. The method as claimed in claim 13 wherein the interface chip and the plurality of non-volatile memory devices are stacked.

23. The method as claimed in claim 13 wherein the interface chip and the plurality of non-volatile memory devices are connected through a substrate.

24. The method as claimed in claim 13 wherein the interface chip and the plurality of non-volatile memory devices are connected with wire bonds.

* * * * *